United States Patent [19]
Urakami et al.

[11] Patent Number: 5,699,071
[45] Date of Patent: Dec. 16, 1997

[54] GLASS ANTENNA SYSTEM FOR AUTOMOBILE

[75] Inventors: Kanta Urakami, Himeji; Nobuya Niizaki, Yokohama; Hirofumi Natsume, Chiba; Masato Arisawa, Tsuchiura; Harunori Murakami; Yuji Baba, both of Osaka, all of Japan

[73] Assignees: Sumitomo Chemical Company, Limited; Nippon Sheet Glass Co., Ltd., both of Osaka, Japan

[21] Appl. No.: 656,833

[22] Filed: Jun. 3, 1996

Related U.S. Application Data

[62] Division of Ser. No. 459,533, Jun. 2, 1995, Pat. No. 5,602,558, which is a continuation of Ser. No. 269,632, Jul. 1, 1994, abandoned, which is a continuation of Ser. No. 857,377, Mar. 25, 1992, abandoned.

[30] Foreign Application Priority Data

Mar. 26, 1991 [JP] Japan ................................ 3-086282
Mar. 26, 1991 [JP] Japan ................................ 3-086284

[51] Int. Cl.⁶ ........................... H01Q 1/32; H01Q 1/50
[52] U.S. Cl. ..................... 343/713; 343/850; 343/860; 333/32
[58] Field of Search ..................... 343/704, 713, 343/850, 852, 853, 858, 860, 865; 333/32, 17.3; H01Q 1/32

[56] References Cited

U.S. PATENT DOCUMENTS

| | | | |
|---|---|---|---|
| 3,771,159 | 11/1973 | Kawaguchi et al. | 343/729 |
| 4,381,566 | 4/1983 | Kane | 455/193 |
| 4,439,771 | 3/1984 | Kume et al. | 343/704 |
| 4,607,323 | 8/1986 | Sokal et al. | 333/32 |
| 4,654,669 | 3/1987 | Kropielnicki et al. | 343/704 |
| 4,914,446 | 4/1990 | Lindenmeier et al. | 343/704 |
| 4,956,710 | 9/1990 | Pugel | 358/188 |
| 5,017,933 | 5/1991 | Sakurai et al. | 343/704 |
| 5,083,134 | 1/1992 | Saitou et al. | 343/704 |
| 5,239,302 | 8/1993 | Maeda et al. | 343/713 |
| 5,258,728 | 11/1993 | Taniyoshi et al. | 343/860 |
| 5,334,988 | 8/1994 | Murakami et al. | 343/713 |

FOREIGN PATENT DOCUMENTS

| | | |
|---|---|---|
| 0 021 762 | 1/1981 | European Pat. Off. . |
| 0 367 555 | 5/1990 | European Pat. Off. . |
| 50-124041 | 8/1974 | Japan . |
| 52-33233 | 8/1975 | Japan . |
| 58-50833 | 3/1983 | Japan . |
| 58-69131 | 4/1983 | Japan . |

OTHER PUBLICATIONS

Sheffield, Berthold, "Filter Design Simplified", Audio Engineering, Mar. 1951, pp. 13–14 & 34–36.

*Primary Examiner*—Donald T. Hajec
*Assistant Examiner*—Tan Ho
*Attorney, Agent, or Firm*—Woodcock Washburn Kurtz Mackiewicz & Norris LLP

[57] ABSTRACT

A glass antenna system for an automobile comprises a T-shaped or pi-shaped dynamic impedance matching circuit. Another system comprises an integrated circuit consisting of T-shaped FM and AM matching circuits each connected to a common cable. The T-shaped or pi-shaped matching circuit comprises at least two varactor diodes each applied to a channel selection voltage to match the FM antenna impedance with that of the FM receiver including that of the transmission cable.

2 Claims, 7 Drawing Sheets

$Rx < RL$

Rx < RL

Rx > RL

Frequency vs.
gain characteristic in
case of preamplifier
& matching circuit

AM interference
fx & fy remote from
f0

AM interference
fx & fy close to f0

GLASS ANTENNA SYSTEM FOR AUTOMOBILE

This application is a divisional of application Ser. No. 08/459,533, filed Jun. 2, 1995, now U.S. Pat. No. 5,602,558, which in turn is a continuation of application Ser. No. 08/269,632, filed Jul. 1, 1994, now abandoned, which in turn is a continuation of application Ser. No. 07/857,377, filed Mar. 25, 1992, now abandoned.

BACKGROUND OF THE INVENTION

1. Field of the Invention

The present invention relates to a glass antenna system for an automobile in which the impedance of a glass antenna provided on the automobile is matched for that of a car radio or receiver connected through a transmission cable. It further relates to a glass antenna system comprising FM and AM antennas each provided on the window glass of the automobile, FM and AM dynamic matching circuits each connected to the corresponding antenna and a common transmission cable.

2. Description of the Prior Art

The inventors proposed with Japanese patent application laid open No. 3-49402 (1991) and utility model application No. 63-143591 (1988) a glass antenna system for an automobile without any preamplifier. The glass antenna 2 as shown schematically in FIG. 1 is connected to a conventional dynamic matching circuit 3 provided on a rear glass 1 and having its circuit factor corresponding to the selected frequency of the receiver 6. On the rear glass 1, a plurality of heaters or wires 4 is printed as an AM antenna 4, while the FM antenna 2 is printed on the upper portion of the most significant heater 4. When the FM antenna 2 is printed on the rear glass 1, its size or dimension is limited even if patterns of the antenna are designed. Accordingly, the resistance component of the FM antenna 2 is often changed between the higher and lower values than that of a transmission cable 5.

FIG. 2 generally shows the active matching circuit 3 comprising a capacitor 10 connected between an input terminal 11 and an input node 12, and a coil 13 connected between the input node 12 and an output node or terminal 14. The input terminal 11 is also connected to the FM antenna 2. The matching circuit 3 further comprises a DC cutoff capacitor 15 having relatively high capacitance (e.g. 0.1 nF) and connected between the input node 12 and a relay node 16, and a varactor diode 17 connected between the relay node 16 and output node 14. A resistor 18 and capacitor 19 each connected to ground are connected to the relay node 16 and the terminal 14 respectively.

The anode of the varactor 17 is grounded through the resistor 18. Therefore, the coil 13, capacitor 15 and varactor 17 constitutes a resonance circuit tuned to a predetermined frequency, to control the resonance frequency by a voltage SE applying to a cathode of the varactor 17 thorough the cable 5.

FIG. 3 shows a basic principle circuit of the conventional dynamic matching circuit shown in FIG. 2. As apparent from an impedance matching theory, the circuit shown in FIG. 3 does not have a matching function when the resistance component Rx of the antenna impedance is higher than that RL of the load impedance. The conventional matching circuit cannot be applied to such glass antenna patterns in case of the Rx more than the RL. The impedance of the load side must have only the resistance component.

When the characteristic impedance of the cable 5 is different from the input impedance of the receiver 6, the impedance viewed from an end of the cable 5, that is, the matching circuit to the receiver includes marginal or reactance component. The gain of the receiving system is reduced because of mismatching between the impedance of the antenna and that of the receiver 6 connected through the cable 5.

As described above, the conventional receiving system having the dynamic matching circuit connected to the glass antenna must fulfill the condition that the resistance component of the antenna impedance is smaller than that of the load impedance of the receiver 6 viewed through the cable 5. Because the antenna impedance range being available is limited and its size of the antenna pattern is then limited, adjustments of its directivity and gain are also limited. Therefore, it is impossible to obtain a suitable glass antenna pattern having desired gain and directivity.

The conventional receiving system has reduced receiving system gains because the impedance of the glass antenna side does not adequately match that of the load side of the receiver in case that the characteristic impedance of the cable is different from the input impedance of the receiver each other.

FIG. 4 shows another prior art of the antenna system having preamplifiers 7 and 8. The same numerals are denoted in parts corresponding to the those of FIG. 1. The FM preamplifier 7 is connected between the FM antenna 2 and the cable 5 while the AM preamplifier 8 is connected between the AM antenna 4 and the cable 5.

In such a conventional receiving system, the FM preamplifier 7 is active when an AM signal is received by the receiver 6. The FM preamplifier 7 has a wide frequency characteristic over the FM broadcast band and does not have a sharp selectivity against a predetermined electric wave to be desired. When the automobile is moved to the area in which strong electric fields of radio waves radiated by at least two FM broadcast stations are overlapped and their frequency's difference is entered within a certain frequency of the AM frequency band, by the intermodulations among those FM radio waves in the FM preamplifier 7 and the receiver 6, undesirable AM signals are generated.

Accordingly, in the conventional receiving system for the automobile having preamplifiers, when the automobile is moved to the area that electric fields of radio waves issued by two or more of FM broadcast stations are strong and their frequency's difference is entered within the AM frequency band, intermodulation noises by those FM radio waves are generated upon receiving the electric wave from the AM station.

SUMMARY OF THE INVENTION

It is a primary object of the present invention to provide an improved dynamic matching circuit for the glass antenna of the automobile. In the improved matching circuit, the impedance of the receiver connected through the cable is matched with that of the glass antenna even if its resistance component of the antenna impedance is changed between higher and lower than that of the load in the specific frequency range for example FM broadcast band. The load side is defined as viewed to the receiver from the end of the cable.

It is another object of the invention to provide the improved dynamic matching circuit for the glass antenna system of the automobile without any preamplifier. Many types of glass antenna patterns are possible by realizing the impedance matching between the glass antenna and receiver or load over the specific frequency range for example FM broadcast band.

It is further object to provide the glass antenna system of the automobile in which the intermodulation noise invaded upon receiving the AM broadcast in the area present two or more of intensive FM broadcast waves having difference of those frequencies being within the AM frequency band.

According to the present invention, the dynamic matching circuit for the glass antenna for the automobile comprises: a main matching circuit connected to an antenna provided on a window glass of the automobile; and at least one auxiliary matching circuit operatively connected between said main matching circuit and a transmission cable, for compensating said main matching circuit.

In the present invention, said main and auxiliary matching circuits are combined to provide the improved matching circuit. The improved matching circuit comprises an antenna reactance cancel circuit for cancelling the reactance of said window glass antenna, a load reactance cancel circuit for cancelling the reactance of said receiver and a conversion circuit for converting the impedance of said antenna after cancelling said reactance of said antenna by said antenna reactance cancel circuit to that of said load after cancelling said reactance of said load by said load cancel circuit.

Further, according to the present invention, the antenna system for the automobile comprises FM and AM antennas each provided on the window rear glass of the automobile, FM and AM dynamic matching circuits each connected to the corresponding antenna, and a common cable connected to said FM and AM dynamic matching circuits. The dynamic matching circuit comprises at least two variable reactance element to which a DC frequency selection signal is applied through the cable from said receiver.

Accordingly, the AM dynamic matching circuit is active based on the AM frequency selection signal upon receiving the AM broadcast. Simultaneously, the FM dynamic matching circuit is active based on the AM frequency selection signal. The intermodulation noise by the FM electric wave upon receiving the AM broadcast can be reduced because the active FM dynamic matching circuit has selectivity for FM band signals and limits the frequency range of the interference FM wave that induces the intermodulation noise.

The above, and other objects, features and advantages of the invention will be apparent in the following detailed description of illustrative embodiments of the invention which is to be read in connection with the accompanying drawings.

DETAILED DESCRIPTION OF A PREFERRED EMBODIMENT

Figure 1:
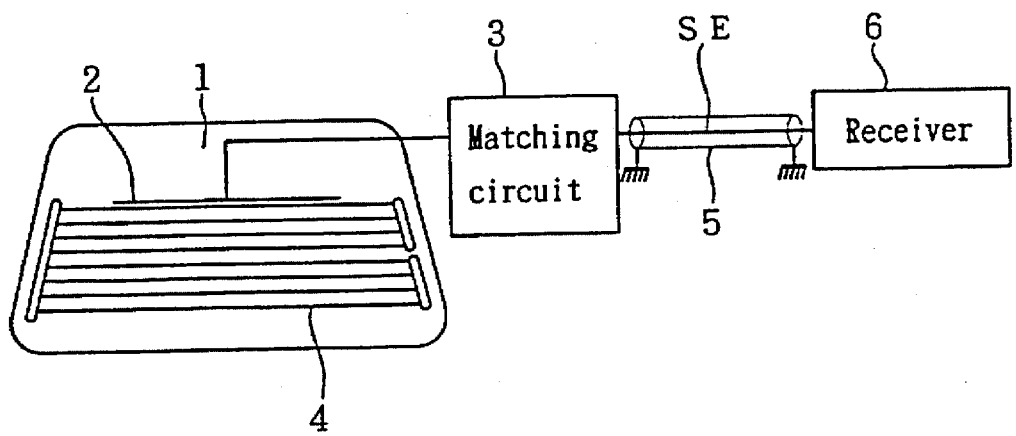
FIG. 1 is a schematic view of a conventional receiving system showing a relation among an antenna on a rear glass of an automobile, a receiver and a dynamic matching circuit.
Figure 2:
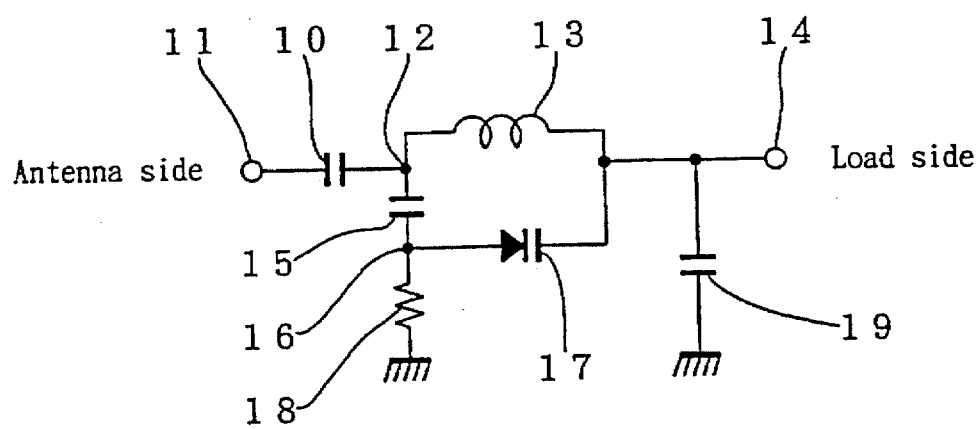
FIG. 2 is a conventional circuit diagram of the dynamic matching circuit.
Figure 3:
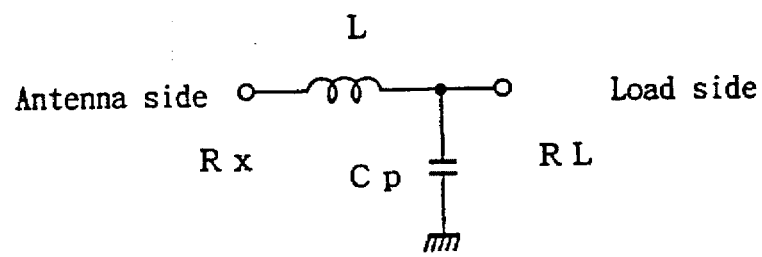
FIG. 3 shows a basic principle circuit of the dynamic matching circuit shown in FIG. 2.
Figure 5:
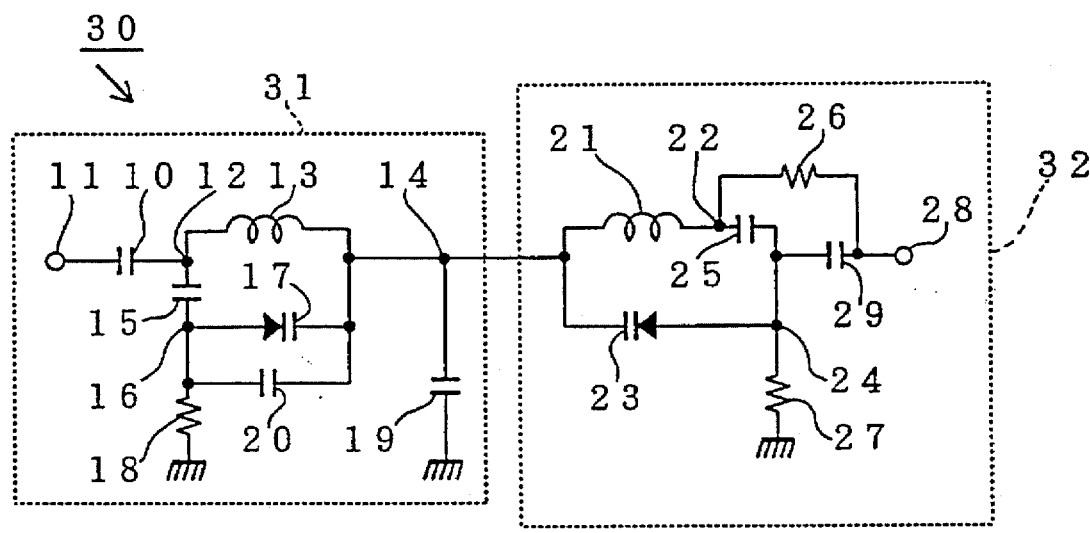
FIG. 5 is a circuit showing an embodiment of the T-shaped dynamic matching circuit according to the present invention.
Figure 6:
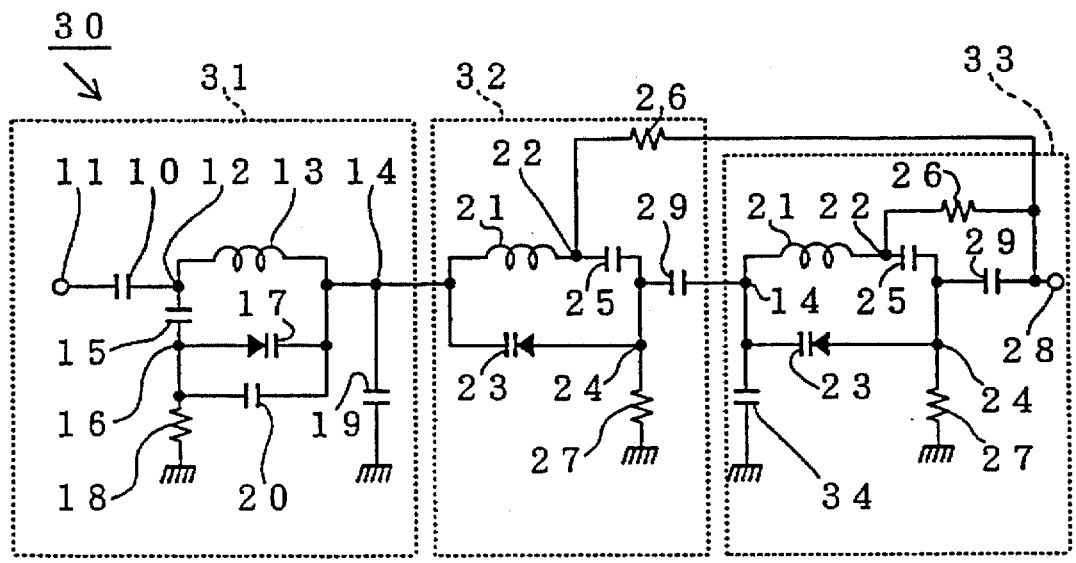
FIG. 6 is a circuit showing an embodiment of a multi-stage or pi-shaped dynamic matching circuit according to the present invention.

FIG. 5 shows a first embodiment of the T-shaped dynamic matching circuit according to the present invention. The T-shaped dynamic matching circuit 30 comprises a main matching circuit 31 connected to an antenna 2 shown in FIG. 1, an auxiliary matching circuit 32 operatively connected between said main matching circuit 31 and the transmission cable 5 shown in FIG. 1. Referring to FIG. 6, another dynamic matching circuit having two of the auxiliary matching circuits 31 cascaded together is shown. In FIG. 5, since the construction of the main matching circuit 31 is identical to that of the conventional dynamic matching circuit 3 except for a 1-picofarad capacitor 20 paralleled to the varactor diode 17, its explanation is omitted.

On the other hand, the auxiliary matching circuit 32 comprises a second coil 21 connected between another input node 14 and another relay node 22. The another input node 14 is common to the output node 14 of the main matching circuit 31. The auxiliary circuit 32 comprises a second varactor diode 23 connected between the input node 14 and another output node 24, a second DC cutoff capacitor 25 connected between the nodes 22 and 24 to provide a second resonance circuit, and resistors 26 and 27 for relaying a capacitance control voltage SE to the varactor diodes 17 and 23. The control voltage SE issued from the receiver 6 is applied to the varactor 23 through the cable 5 and a load-side terminal 28, while the FM signal from the antenna 2 passed through a coupling capacitor 29 connected between the output node 24 and terminal 28. The resistor 26 is therefore connected between the terminal 28 and relay node 22 while the resistor 27 is connected between the output node 24 and ground.

Accordingly, the T-shaped dynamic matching circuit 30 has variable reactance circuits including its central capacitor 19, and varactor diodes 17 and 23 each disposed on right and left branches. Their reactance is controlled by the capacitance of the varactor diodes with the common frequency control voltage supplied from the receiver 6.

In the embodiment of FIG. 5, values of the capacitors 10, 19 and 29 may be set to be 6, 10 and 6 picofarads respectively, and values of the capacitors 15 and 25 may be set to be 100 nanofarads. The resistors 18, 26 and 27 may have 100 kilo-ohms or higher than the 100 kilo-ohms because reverse bias voltage is applied to the varactor diodes 17 and 23 to adjust their capacitance without a certain power consumption. The coils 13 and 21 may be 200 nanohenry. The varactor diodes 17 and 23 may be a type No. 1SV153.

In the multi-stage dynamic matching circuit 30 comprising a plurality of auxiliary matching circuits 32 and 33 as shown in FIG. 6, the construction of the first auxiliary matching circuit 32 is identical to that of the second auxiliary matching circuit 33 except for an additional capacitor 34 connected between the input node 14 and ground. This grounded capacitor 34 has a function substantially identical to that of the capacitor 19. The coupling capacitor 29 of the first auxiliary matching circuit 32 is connected between its output node 24 and the input node 14, of the second auxiliary matching circuit 33. In the multi-stage dynamic matching circuit 30 according to the present invention, a third or more of auxiliary matching circuits 32 may be employed.

Figure 4:
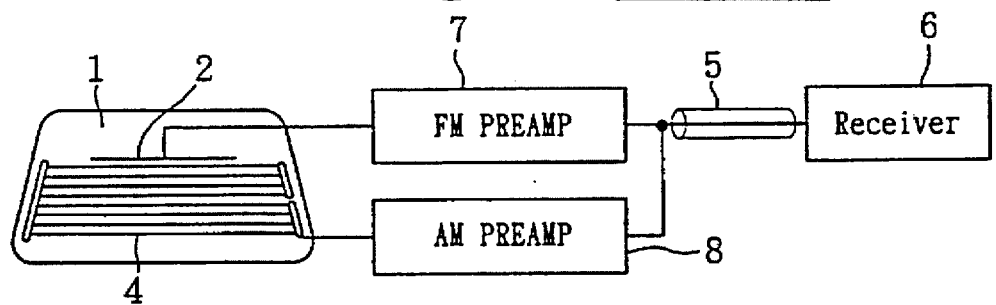
FIG. 4 shows another prior art of the antenna system having preamplifiers.
Figure 7:
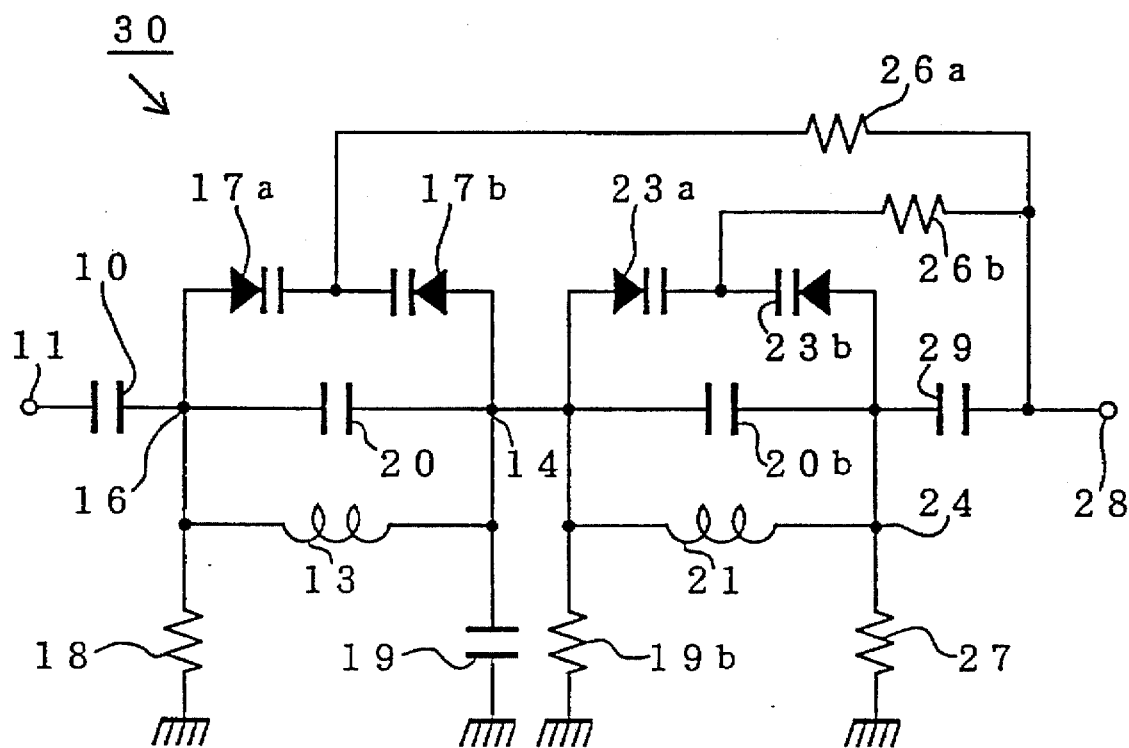
FIG. 7 is a circuit diagram showing another embodiment of the T-shaped dynamic impedance matching circuit according to the present invention.

FIG. 7 shows another embodiment of the T-shaped dynamic matching circuit 30. In the drawing, an input terminal 11 is connected to the glass antenna 2 while an output terminal 28 is connected to the transmission cable 5 as shown in FIG. 4. The patching circuit 30 comprises a central capacitor 19 connected between a first node 14 and ground, and first and second variable reactance circuits as right and left branch configurations. The first variable reactance circuit comprises a coupling capacitor 10 connected between the input terminal 11 and a second node 16. A coil 13 and a capacitor 20 are connected between the first and second nodes 14 and 16. Anodes of cathode common varactor diodes 17a and 17b are connected to the second and first nodes 16 and 14 respectively. The common cathode of the varactor diodes 17a and 17b is connected to the output terminal 28 through a resistor 26a. The second variable reactance circuit comprises a coupling capacitor 29 connected between the output terminal 28 and a third node 24. Another coil 21 and a capacitor 20b are connected between the first and third nodes 14 and 24. Anodes of cathode common varactor diodes 23a and 23b are connected to the first and third nodes 14 and 24 respectively. The common cathode of the varactor diodes 23a and 23b is connected to the output terminal 28 through a resistor 26b.

Resistors 19b, 18 and 27 each connected to ground are connected to the first, second and third nodes 14, 16 and 24 respectively to apply a bias voltage to the varactor diodes 17a, 17b, 23a and 23b through the resistors 26a and 26b.

In this embodiment, to set the impedance viewed from the cable 5 to be 75 ohms, the saw-toothed voltage sweep is applied to the common cathodes of the varactor diodes 17a, 17b, 23a and 23b as well as the inner varactor diode in the FM receiver. The sweep has the voltage range corresponding to the predetermined FM frequency band. When an appropriate FM channel at a given frequency is selected by the FM receiver, the appropriate voltage is applied to the matching circuit to match the FM antenna with the FM receiver through the transmission cable at the given frequency. Reactance component of the antenna at the given frequency is therefore cancelled with controlled capacitance of the varactor diodes.

For example, the resistors 18, 19b, 27, 26a and 26b may have 100 kilo-ohms or more. The capacitor 10 may have 5 to 50 picofarads (e.g., 30 picofarads), while the capacitor 29 have 5 to 50 picofarads (e.g., 10 picofarads). The capacitor 19 may have 5 to 50 picofarads (e.g., 10 picofarads), while the capacitors 20 and 20b have 0 to 50 picofarads (e.g., 2 picofarads). The coils 13 and 21 may have 100 to 300 nanohenry (e.g., 200 nanohenry). The varactor diodes 17a, 17b, 23a and 23b may be a type No. 1SV161.

Particularly, the matching circuit as shown in FIG. 7 can effectively reduce a noise induced in a strong or intensive electric field of broadcast electric waves.

In such T-shaped or multistage dynamic matching circuit 30, a DC voltage SE of the frequency selection signal from the receiver 6 is applied through a core line of the coaxial cable 5. In the embodiment of FIG. 5, since the characteristic impedance of the cable 5 is 122 ohms and the input impedance of the receiver 6 or load may be 75 ohms, the impedance viewed to the receiver or load side through the cable 5 contains imaginary component and its value is changed in response to the frequency.

Figure 8:
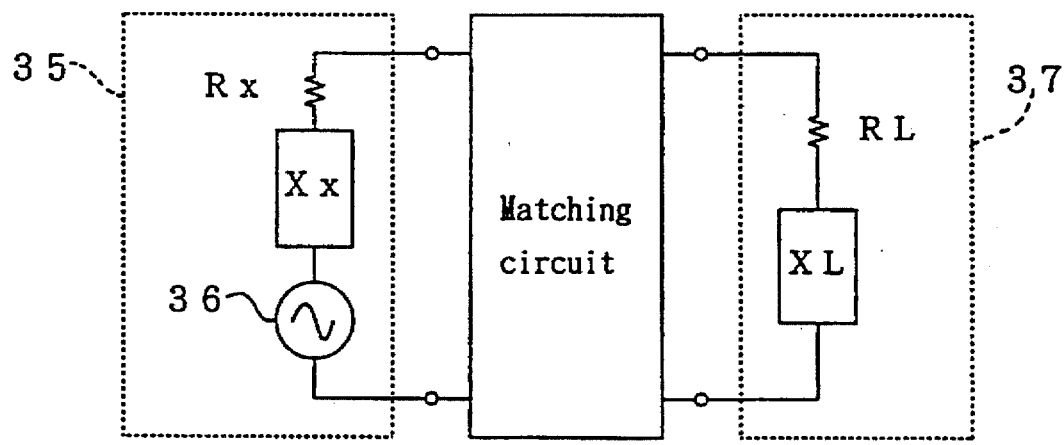
FIG. 8 is an equivalent receiving system using the T-shaped dynamic matching circuit of FIG. 5.

FIG. 8 shows an equivalent circuit of the receiving system comprising the T-shaped dynamic matching circuit of FIG. 5, the rear glass antenna 2 and the receiver 6. The resistance and reactance components of the glass antenna 35 at the specific frequency are assumed to be Rx and Xx respectively. The source of the electric wave signal is assumed to be 36. The resistance and reactance components of the black box 37 viewed to the receiver load side through the transmission cable glass are assumed to be RL and XL respectively.

Figure 9A:
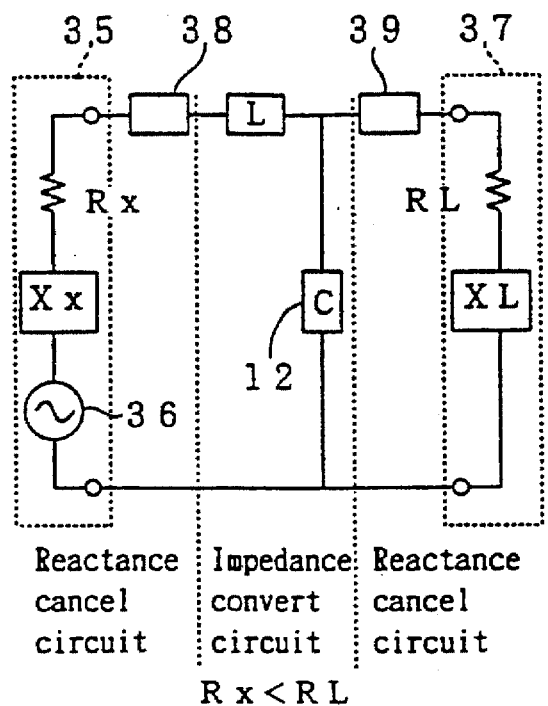
FIG. 9 is a block diagram in which an operation of the receiving system of FIG. 8 is resolved into basic functions.

FIG. 9 is a block diagram in which an operation of the equivalent receiving system of FIG. 8 is resolved into basic functions. In drawing, same numerals are denoted to parts corresponding to the those of FIG. 8. When Rx<RL, it composes an antenna reactance cancel circuit 38 for cancelling the reactance component of the antenna by the variable reactance circuit on the left side or antenna side branch as shown in FIG. 9a. The cancel circuit 38 is provided with he resonance circuit consisting of the coil 13, capacitors 15 and 20 and varactor diode 17. An impedance converter or circuit converts to RL the remaining L component after cancelling the antenna reactance and the resistance component when the capacitor 19 is viewed from output or load side to antenna side.

While, it composes a load reactance cancel circuit 39 for cancelling the reactance component of the impedance viewed to the receiver or load side through the cable by the variable reactance circuit on the right side or cable side branch, that is, by another resonance circuit consisting of the coil 21, capacitor 25 and varactor diode 23. Therefore, impedance between the antenna side and receiver side are adequately matched.

Figure 9B:
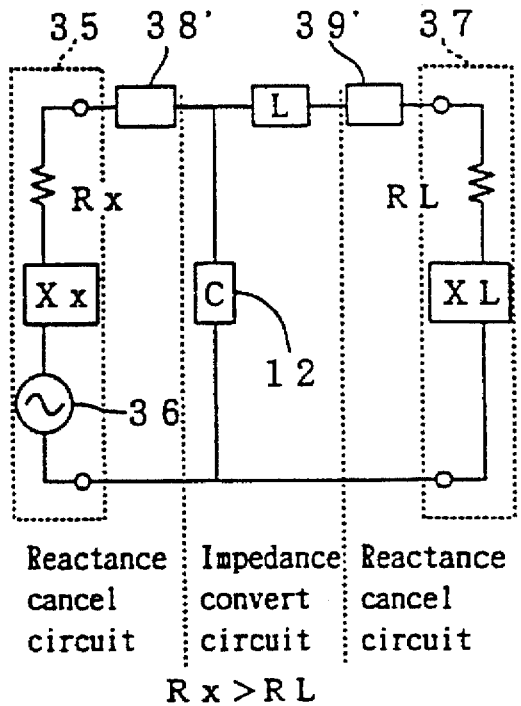

On the contrary, when Rx>RL, it composes a first reactance cancel circuit 38' for cancelling the reactance component of the antenna by the variable reactance circuit on the left side or antenna side branch as shown in FIG. 9b, that is, by the resonance circuit consisting of the coil 13, capacitors 15 and 20 and varactor diode 17.

It further comprises a second reactance cancel circuit 39' for cancelling the reactance component of the impedance viewed to the receiver or load side through the cable by the variable reactance circuit on the right side or cable side branch, that is, by another resonance circuit consisting of the coil 21, capacitor 25 and varactor diode 23. Another impedance converter or circuit converts to RL the remaining L component after cancelling the cable reactance and the resistance component when the capacitor 19 is viewed from output side to antenna side. In this case, the impedance between the antenna side and the receiver side is adequately matched. Again, when Rx>RL, the impedance between the antenna side and receiver side is adequately matched by having the functions of the branch circuits reversed to those of Rx<RL case vice versa.

Figure 10:
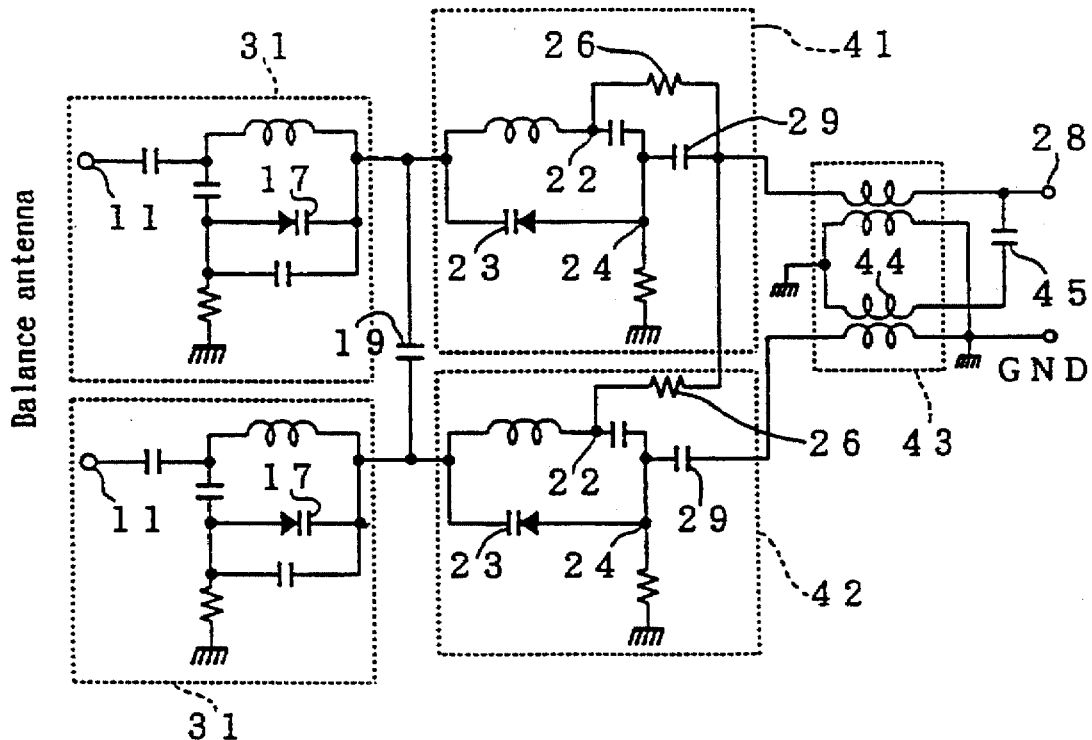
FIG. 10 is a circuit showing an embodiment of a H-shaped dynamic matching circuit according to the present invention modified from the dual unbalanced T-shaped dynamic matching circuits each shown in FIG. 5 to its balanced configuration.

FIG. 10 shows an embodiment of a balanced dynamic matching circuit modified from the dual unbalanced T-shaped dynamic matching circuits each shown in FIG. 5. In the FIG. 10, a balanced antenna is connected to the input terminals 11 of two main matching circuits 31, 31 except for the capacitor 19 connected between the respective output nodes 14, 14 of the main matching circuits 30, 30. The output nodes of the main matching circuits 31, 31 are connected to the input nodes 14 of the auxiliary matching circuits 41, 42. The output nodes 24, 24 of the auxiliary matching circuits 41, 42 are connected to primary windings of a 4 to 1 Balance to Unbalance transformer 43 through the respective coupling capacitors 29, 29.

This transformer 43 converts the balance impedance of for example 300 ohms to 75 ohms and its output is connected to the transmission or coaxial cable 5 of for example 75 ohms. While, capacitance adjusting voltage SE is applied to the respective varactor diodes 23, 23, 17, 17 of the main and auxiliary matching circuits 31, 31, 41, 42 through the core conductor of the cable 5, one of the primary winding and resistors 26, 26. In the auxiliary matching circuits 42 having its output connected to ground through another primary winding, the resistor 26 is connected to the output side of the capacitor 29 of the circuit 41. The secondary winding 44 opposed to the grounded primary winding is connected to a high pass capacitor 45 connected to the output terminal to prevent the control voltage SE flowing through the core conductor of the cable 5 from shorting to ground.

As described above, the dynamic matching circuit according to the invention comprises a main matching circuit connected to an antenna provided on a window glass of the automobile. It further comprises at least one auxiliary matching circuit operatively connected between said main matching circuit and a transmission cable, for compensating said main matching circuit. When the resistance component of the antenna impedance is more than that of the load impedance, the auxiliary matching circuit can compensate or assist the main matching circuit even if the main matching circuit can not be matched between the antenna and load side. Therefore, the antenna can be matched with the load side regardless of size between resistance component of the antenna impedance and that of the load impedance. Further, in the receiving system, the fall or reduction of the gain is occurred by impedance mismatching between the antenna and load including the cable.

In another embodiment of the dynamic matching circuit according to the present invention, said main and auxiliary matching circuits are combined to provide the T-shaped matching circuit so that variable reactance circuits are constituted on right and left branches. Therefore, respite of simple circuit construction, as a role of the branches can be exchanged according to the size of resistance components of their impedance between the antenna and load sides, a superior impedance matching between the antenna and load can be performed regardless the sizes thereof.

Figure 11:
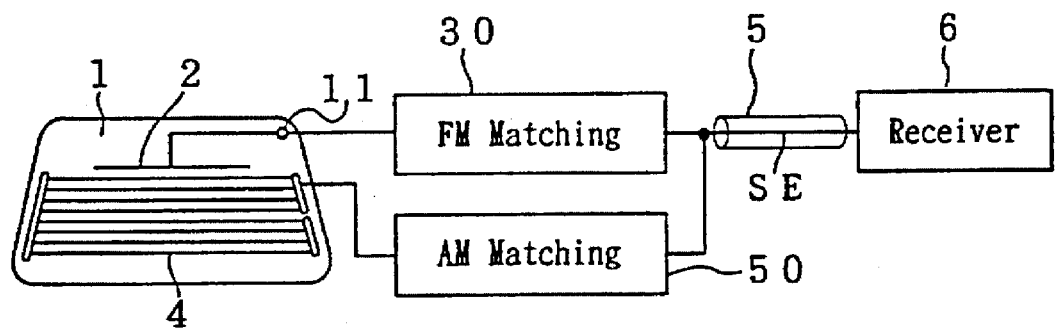
FIG. 11 is another embodiment of the antenna system for the automobile comprising FM and AM dynamic matching circuits according to the present invention.

FIG. 11 shows a second embodiment of the glass antenna for the automobile according to the present invention. The same numerals are denoted in parts corresponding to the those of FIGS. 1 or 5. The antenna system comprises an AM antenna consisting of a plurality of defogging heaters 4 each providing on the rear glass 1, a reverse T-shaped FM antenna 2 provided on the rear glass 1 above the heaters 4, an FM dynamic matching circuit 30 connected to the FM antenna 2 through the input terminal 11 and an AM dynamic matching circuit 50 connected to the AM antenna 4. The outputs of the FM and AM dynamic matching circuits 30 and 50 are combined to connect to the receiver 6 through the common transmission cable 5. The FM and AM dynamic matching circuits 30 and 50 are integrated on a common substrate that is mounted on the rear glass 1.

Figure 12:
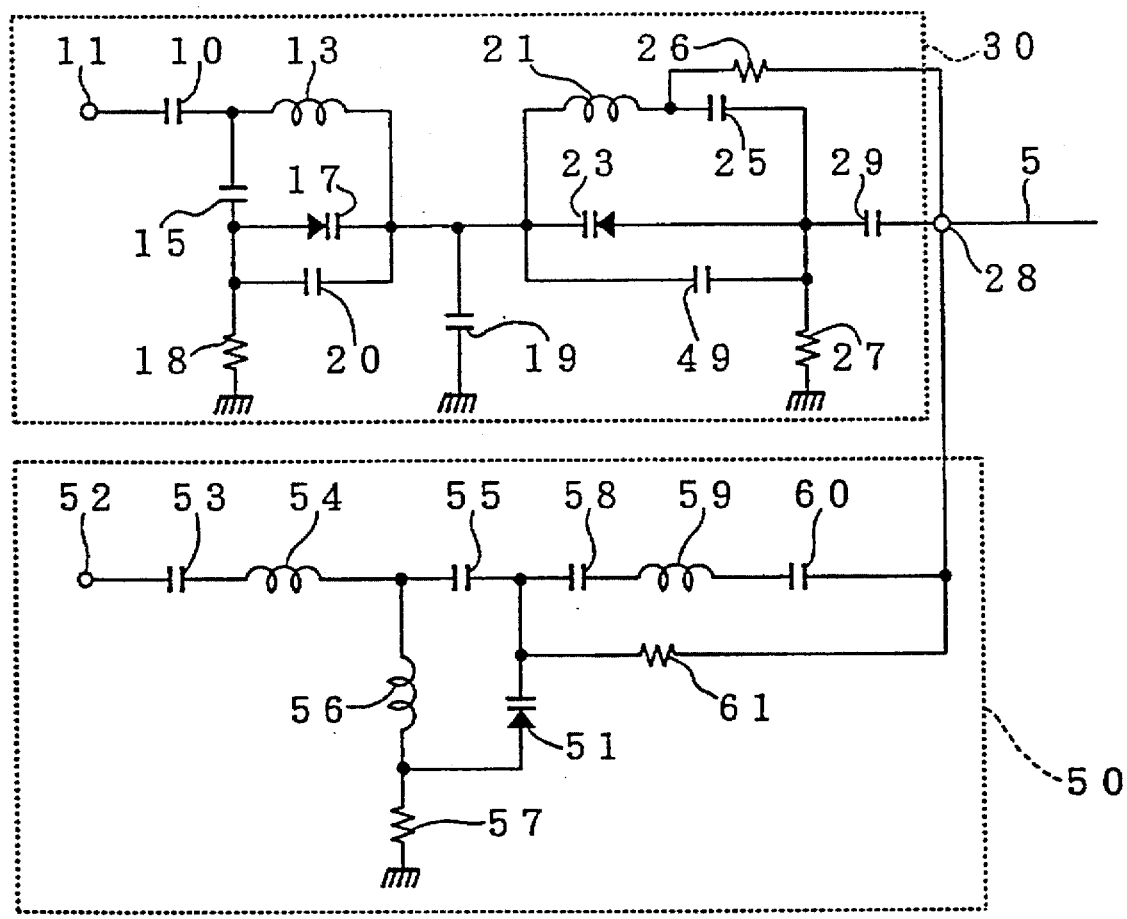
FIG. 12 is a circuit showing an embodiment of the FM and AM dynamic matching circuits of FIG. 11.

The FM dynamic matching circuit 30 comprises varactor diodes 17 and 23 to which a DC frequency selection signal is applied from the receiver 6 through the cable 5 as shown in FIG. 12. The AM matching circuit 50 comprises a third varactor diode 51 to which the DC frequency selection signal is also applied.

The FM dynamic matching circuit 30 is T-shaped configuration as shown in FIG. 12 and comprises the capacitor 10 connected to the FM antenna 2 shown in FIG. 11 through the input terminal 11. Another end of the capacitor 10 is connected to the coil 13 and capacitor 15. The varactor 17 is connected between another ends of the coil 13 and capacitor 15 to provide a first resonance circuit. The anode of the varactor 17 is grounded through the resistor 18 and paralleled to the, for example, 1 picofarad capacitor 20 between its anode and cathode.

Another end of the coil 13 is grounded through the capacitor 19 and connected to the second coil 21 and a cathode of the second varactor 23. The capacitor 25 is connected between another end of the second coil 21 and anode of the second varactor 23 to provide a second resonance circuit. The anode of the varactor 23 is connected to the cable 5 through the capacitor 29 and the load side terminal 28. The resistor 26 is connected between the load side terminal 28 and the another end of the second coil 21 to bypass the capacitors 25 and 29 for DC supplying. The anode of the varactor 23 is grounded through the resistor 27.

Therefore, the frequency selection signal applied to the load side terminal 28 is supplied to varactors 17 and 23. A capacitor 49 having for example 1 picofarad is connected between the anode and cathode of the varactor 23.

On the contrast, the AM dynamic matching circuit 50 comprises a capacitor 53 connected to the AM antenna 4 shown in FIG. 11 through the input terminal 52. Another end of the capacitor 53 is connected to a third coil 54. Another end of the third coil 54 is connected to a capacitor 55 having its relatively high capacitance and a fourth coil 56. The third varactor 51 is connected between the capacitor 55 and the coil 56 to provide a third resonance circuit.

The anode of the varactor 51 is grounded through a resistor 57. The cathode of the varactor 51 is connected to a fifth coil 59 through a capacitor 58 and in turn connected to the load side terminal 28 through another capacitor 60. A resistor 61 is connected between the load side terminal 28 and the cathode of the varactor 51 to bypass the capacitors 58 and 60 to apply the frequency selection signal to the varactor 51.

Figure 13:
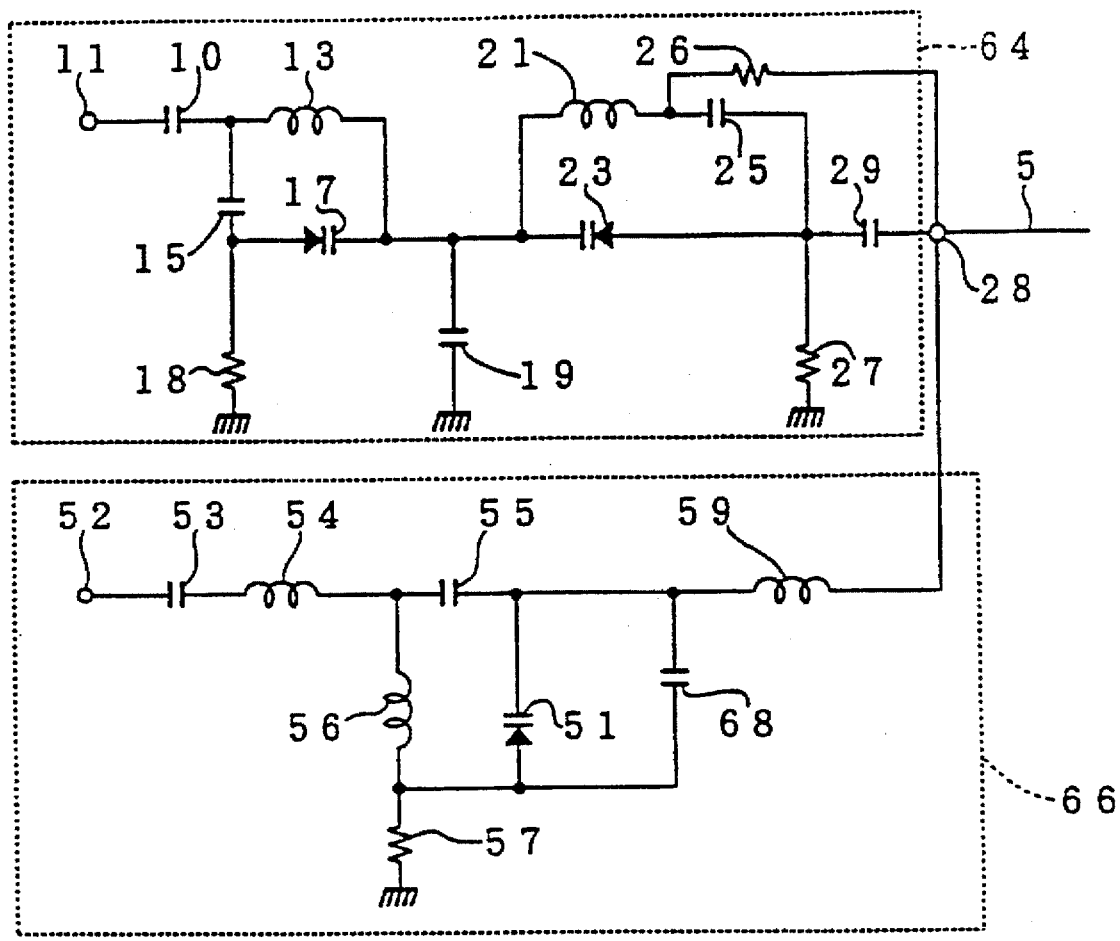
FIG. 13 is a circuit showing another embodiment of the FM and AM dynamic matching circuits of FIG. 11.

FIG. 13 shows a second embodiment of the FM and AM dynamic matching circuits 64 and 66 as an integrated circuit. In FIG. 13, members corresponding to those of FIG. 12 denote same numerals. The FM dynamic matching circuit 64 is different from the FM dynamic matching circuit 30 as shown in FIG. 12 in that the capacitors 20 and 49 are omitted.

The AM dynamic matching circuit 66 is simplified compared to the AM dynamic matching circuit 50 as shown in FIG. 12. The capacitors 58 and 60 are omitted as well as the resistor 61 to access the AM signal and DC frequency selection signal through the coil 59. A Compensating capacitor 68 having its several picofarads is connected between the anode and cathode of the varactor 51. The frequency selection signal is then applied to the varactor 51 through the coil 59.

In the embodiments of FIGS. 12 and 13, values of the capacitors 10, 19 and 29 may be set to be 6, 10 and 6 picofarads respectively, and values of the capacitors 15 and 25 are 100 nanofarads. The resistors 18, 26 and 27 may have 100 kilo-ohms or higher than the 100 kilo-ohms because reverse bias voltage is applied to the varactor diodes 17 and 23 to adjust their capacitance without a certain power consumption. The coils 13 and 21 may be 200 nanohenry. The varactor diodes 17 and 23 may be a type No. 1SV153. The varactor diode 51 may be another type No. KV1450.

The FM /AM integrated dynamic matching circuits 30 and 50 as shown in FIGS. 12 and 13 are mounted on the rear glass 1 and their circuit constants are changed by the frequency selection signal from the receiver 6. The integrated dynamic matching circuits each mounted on the rear glass 1 are controlled by the frequency selection signal or channel selection voltage in the receiver, which is supplied from it through the transmission cable 5.

Figure 14A:
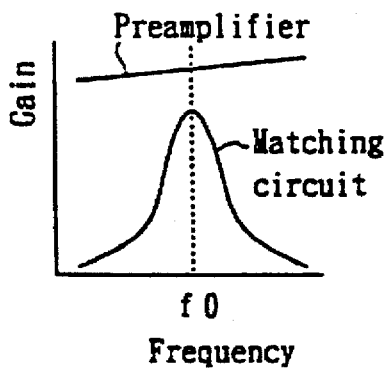
FIG. 14 is a graph showing frequency to gain characteristics between the present FM dynamic matching circuit of FIGS. 12 and 13 according to the present invention and the conventional preamplifier of FIG. 4.
Figure 14B:
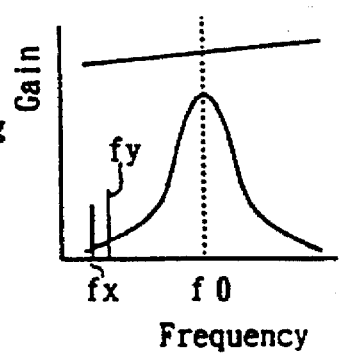
Figure 14C:
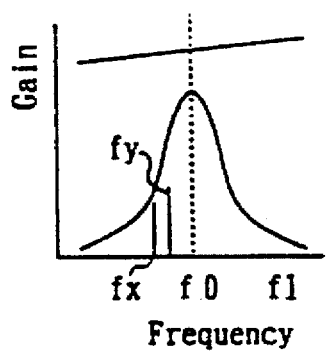

The channel selection voltage is applied to both of the FM and AM dynamic matching circuits 30 and 50 upon selecting an AM or FM broadcast or channel station. The AM channel selection voltage for the AM dynamic matching circuit 50 is also applied to the FM dynamic matching circuit 30 upon selecting the AM broadcast or channel station. FIGS. 14a, 14b and 14c show frequency versus gain characteristic by using the conventional preamplifier as shown in FIG. 4, or the present FM dynamic matching circuit 30 on which the specific frequency f0 within the FM band is matched. In the FIG. 14a, the FM gain characteristic of the FM/AM integrated dynamic matching circuits according to the present invention has a relatively narrow or peak selectivity at the f0 while the conventional receiving system having the preamplifier has generally a flat or monotonic gain characteristic.

The FM matching frequency of the FM dynamic matching circuit is assumed to be f0 when the AM channel selection voltage is applied to it to receive a certain AM channel. Two FM electric waves possibly given interferences to the certain AM channel upon receiving are assumed to be fx and fy. The AM matching frequency of the AM dynamic matching circuit is assumed to be fa where fa=|fx-fy|. In case of using the FM/AM integrated dynamic matching circuits according to the present invention, when the fx and fy are remote from the f0 as shown in FIG. 14b, the intermodulation noise is reduced sufficiently upon receiving the certain AM channel because the fx and fy are attenuated sufficiently upon passing through the FM dynamic matching circuit.

Similarly, even if the fx or fy is close to the f0 as shown in FIG. 14c, the intermodulation noise is also reduced relatively upon receiving the certain AM channel because the reining fy or fx is attenuated relatively upon passing through the FM dynamic matching circuit. Namely, in case of using the FM/AM integrated dynamic matching circuits according to the present invention, if the frequency with the pair of the FM interference channels fx and fy is remote from the f0, the intermodulation noise is reduced sufficiently, or close to the f0, the intermodulation noise is reduced relatively. In either case, because the FM dynamic matching circuit has a relatively narrow frequency selectivity having a peak at the specific FM frequency with respect to the specific AM selection voltage and no non-linear amplifier element is employed in the circuit, it is difficult to induce the intermodulation noise by the FM interference channels or stations. It is possible to modify the condition of the fx and fy as shown in FIG. 14c by shifting to another FM matching frequency f1 the matching frequency f0 of the FM dynamic matching circuit upon applying the specific AM channel selection voltage, by modifying circuit constants of the FM or AM dynamic matching circuit. In the embodiments shown in FIGS. 12 and 13, although the common channel selection signal is applied to both of the FM and AM dynamic matching circuits, change of the frequency may be ascended or descended against the ascending selection voltage. For example, the FM dynamic matching circuit may match at the frequency of 90 MHz while the AM dynamic matching circuit may match at the frequency of 535 KHz when the selection voltage is zero volt. The FM dynamic matching circuit may match at the frequency of 76 MHz while the AM dynamic matching circuit may match at the frequency of 1605 KHz when the selection voltage is 10 volts.

In the conventional receiving system having the FM preamplifier 7 shown in FIG. 4, because the frequency versus gain characteristic of its preamplifier is substantially flat shown in FIG. 14, the FM signal is not attenuated where the pair of the FM interference channels fx and fy is within the FM band. As the preamplifier 7 has non-linear gain, the intermodulation noise is generated upon receiving FM interference channels to produce higher intermodulation noise.

Therefore, the intermodulation noise by the FM stations upon receiving the AM signal is reduced compared to that of the conventional receiving systems as shown in FIG. 4, by providing the FM dynamic matching circuit having its circuit constants in response to the frequency selection signal to the FM glass antenna according to the present invention as shown in FIGS. 12 and 13.

The FM and AM dynamic matching circuits as shown in FIGS. 12 and 13 are controlled by the common channel selection voltage. Alternatively, the FM and AM dynamic matching circuits may have a different voltage ranges for make them matching within respective frequency bands. The constants of the matching circuits are determined so that the varactor diodes 17 and 23 receive a first voltage range of the frequency selection signal effectively to match within the FM frequency band while the varactor diode 51 receives a second voltage range of the frequency selection signal effectively to match within the AM frequency band.

In this case, the capacitance of the capacitors and type number of the varactors are determined so that the FM dynamic matching circuit is matched with the range of zero to 10.0 volts in the FM frequency bandwidth of 76 to 90 MHz while the AM dynamic matching circuit is matched with the range of 10.1 to 20.0 volts in the AM frequency bandwidth. Then, the FM dynamic matching circuit does not match within the FM band and then the FM signal passing through the FM dynamic matching circuit is greatly attenuated when the specific voltage within the range of 10.1 to 20.0 volts is applied to the AM dynamic matching circuit. The first voltage range may partially include the second voltage range.

Figure 15:
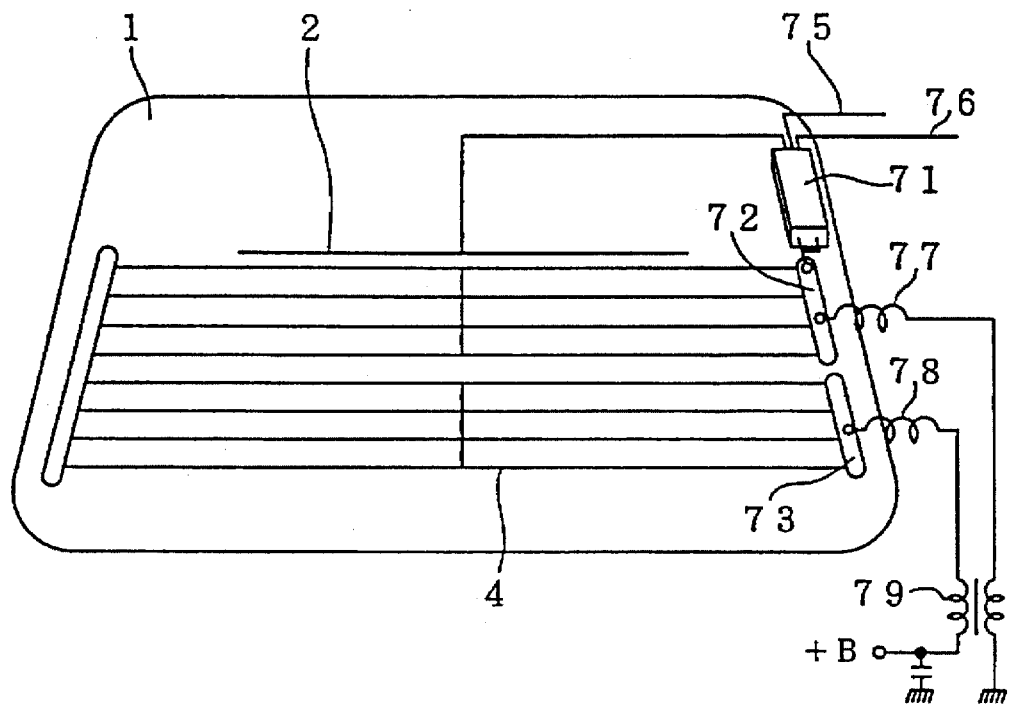
FIG. 15 is a schematic view of an embodiment of a window glass antenna according to the present invention.
Figure 16:
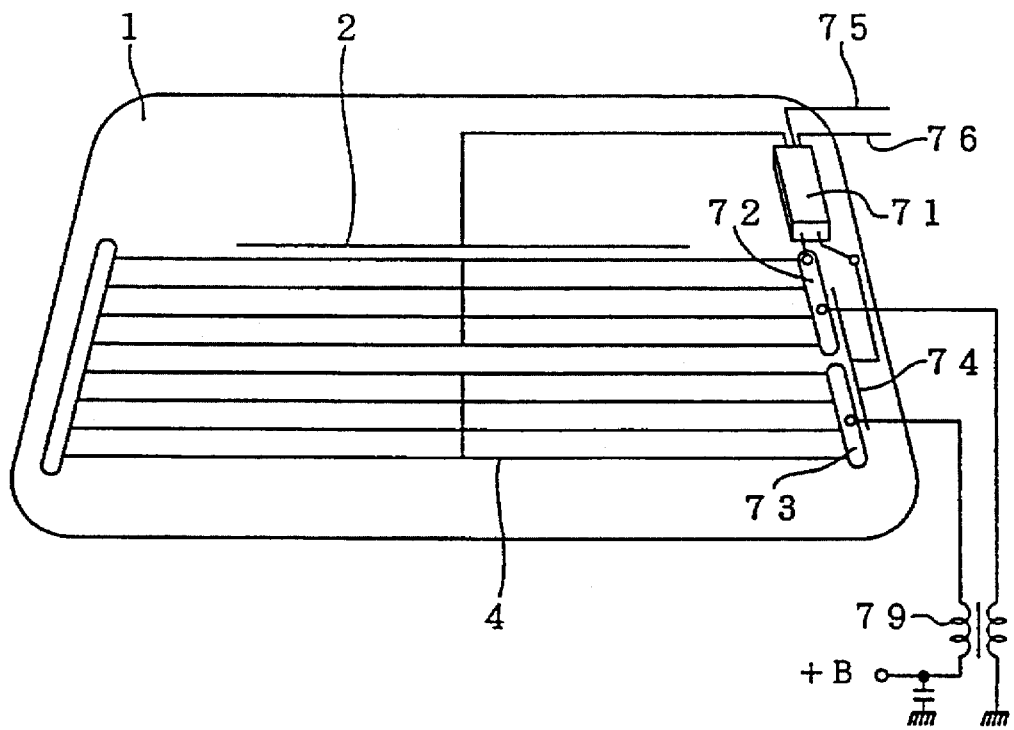
FIG. 16 is a schematic view of another embodiment of a window glass antenna according to the present invention.

It is apparent to employ balanced dynamic matching circuits though FIGS. 12 and 13 show unbalanced dynamic matching circuits. The present invention is not only applied with the unbalanced antenna system but also with the balanced antenna system. FIGS. 15 and 16 show embodiments in which a plurality of heaters 4 applied or printed on the rear glass 1 employs both as an AM antenna 4 and FM subsidiary antenna 4. The reverse T-shaped FM main antenna 2 is applied or printed on the rear glass 1 above the heaters 4.

The FM and AM signals from the AM/FM antenna 4 as shown in FIG. 15 is commonly inputted to the FM /AM integrated dynamic matching circuit 71. The AM/FM antenna 4 as shown in FIG. 16 is different from that of FIG. 15 in which power buses 72 and 73 each connected to heaters 4 are paralleled to a lateral T-shaped FM subsidiary pattern 74 to receive an FM subsidiary signal to the FM dynamic matching circuit, and an AM signal from the bus 72 is inputted directly to the AM dynamic matching circuit.

Accordingly, in the FM/AM integrated dynamic matching circuit 71 mounted on the rear glass 1, two FM dynamic matching circuits for use in the FM main and subsidiary antennas 2 and 4, and the AM dynamic matching circuit are integrated on a common substrate. The outputs of one FM dynamic matching circuit and the AM dynamic matching circuit are combined and then connected to the receiver (not shown) through the transmission cable 75 of for example 5P3-30BA. The output of the remaining FM dynamic matching circuit is connected to the receiver (not shown) through the transmission cable 76 of for example 1.5C–2V. In this case, the FM matching circuits for the FM main antenna and the AM dynamic matching circuit may be FM dynamic matching circuit 30 or 64 and the AM dynamic matching circuit 50 or 66 respectively as shown in FIGS. 12 or 13. The FM matching circuits for the FM subsidiary antenna may be FM dynamic matching circuit 30 or 64 as shown in FIGS. 12 or 13. The FM subsidiary and/or AM antenna has FM coils 77 and 78 each having for example 1.6 micro-henry and connected directly to the power buses 72 and 73 respectively to provide a monotone change with respect to its impedance frequency characteristic in the FM bandwidth. The other end of the FM coils 77 and 78 are connected to windings of the choke coil 79 so that 12 volts DC voltage is applied upon defogging the rear glass 1.

As described above, the present glass antenna system for the automobile of the invention has an integrated circuit mounted on the glass antenna and comprising the FM and AM dynamic matching circuits without any preamplifier. The FM dynamic matching circuit is active upon receiving the AM broadcast signal. Its gain characteristic to the FM electric wave has a narrow selectivity. The probability for reducing the FM interference electric wave is higher than that of the conventional receiving systems having preamplifier. Therefore, the present invention has another advantage to attenuate the intermodulation noise invaded upon receiving the AM signal in the area within which two or more of strong FM broadcast waves each having strong intensity or electric field and their frequency difference entering within the frequency range of the AM broadcast.

What is claimed is:

1. A glass antenna system for an automobile comprising:

two main matching circuits each connected to an antenna provided on a window glass of the automobile, each of said main matching circuits including a first coil and a first varactor diode connected thereto, to provide first resonance circuits, and two auxiliary matching circuits each connected to one of said main matching circuits through a common node, each of said auxiliary matching circuits including a second coil and a second varactor diode connected thereto, to provide second resonance circuits;

a capacitor connected between two of said common node;

a transmission cable operatively connected to said auxiliary matching circuits through an output terminal; and resistors each connected to said output terminal and each applying a voltage to said second varactor diode through said second coil.

2. A glass antenna system for an automobile comprising:

a main matching circuit connected to an antenna provided on a window glass of the automobile, said main matching circuit including a first coil and a first pair of cathode-common varactor diodes connected thereto, to provide first resonance circuits; and an auxiliary matching circuit connected to said main matching circuit through a common node, said auxiliary matching circuit including a second coil and a second pair of varactor diodes having a common cathode connected thereto, to provide second resonance circuits;

a capacitor connected between said common node and ground;

a transmission cable operatively connected to said auxiliary matching circuit through an output terminal; and resistors each connected between said output terminal and said common cathode.

* * * * *